United States Patent
Götz

(10) Patent No.: US 10,122,126 B2
(45) Date of Patent: Nov. 6, 2018

(54) MODULAR SYSTEM HAVING A PLURALITY OF MODULES THAT CAN BE ELECTRICALLY CONNECTED TO ONE ANOTHER

(71) Applicant: Dr. Ing. h.c. F. Porsche Aktiengesellschaft, Stuttgart (DE)

(72) Inventor: Stefan Götz, Forstern (DE)

(73) Assignee: Dr. Ing. h.c. F. Porsche Aktiengesellschaft, Stuttgart (DE)

( * ) Notice: Subject to any disclaimer, the term of this patent is extended or adjusted under 35 U.S.C. 154(b) by 0 days.

(21) Appl. No.: 15/688,390

(22) Filed: Aug. 28, 2017

(65) Prior Publication Data
US 2018/0062327 A1 Mar. 1, 2018

(30) Foreign Application Priority Data
Aug. 30, 2016 (DE) .......................... 10 2016 116 127

(51) Int. Cl.
*H01R 13/71* (2006.01)
*H01R 13/04* (2006.01)
(Continued)

(52) U.S. Cl.
CPC ........... *H01R 13/71* (2013.01); *H01R 9/2408* (2013.01); *H01R 13/04* (2013.01); *H01R 13/112* (2013.01);
(Continued)

(58) Field of Classification Search
CPC .............. H01R 23/7068; H01R 23/725; H01R 2103/00; H01R 13/7032
(Continued)

(56) References Cited

U.S. PATENT DOCUMENTS 1,551,267 A 8/1925 Schenck
4,087,151 A * 5/1978 Robert ................... H01R 23/70
200/51.1
(Continued)

FOREIGN PATENT DOCUMENTS

DE 29807313 U1 7/1998
DE 202006012687 U1 12/2007
(Continued)

OTHER PUBLICATIONS

German Search Report for German Application No. 10 2016 116 127.6, dated Aug. 2, 2017, including partial English translation, 9 pages.
(Continued)

*Primary Examiner* — Gary Paumen
(74) *Attorney, Agent, or Firm* — RatnerPrestia

(57) ABSTRACT

A modular system, including a plurality of modules that can be electrically connected to one another, wherein at least two first modules from amongst the modules can be connected to one another in series, wherein, in the connected state of the first modules, a first contact-making means is arranged between the first modules, wherein a second of the modules has a second contact-making means, wherein the first contact-making means and the second contact-making means are configured to make electrical contact with one another, wherein the first contact-making means and the second contact-making means are configured, when making electrical contact with one another, firstly to connect the first modules to the second module and then to isolate the connection of the first modules to one another.

12 Claims, 6 Drawing Sheets

(51) Int. Cl.
  *H01R 13/11* (2006.01)
  *H05K 5/00* (2006.01)
  *H05K 5/02* (2006.01)
  *H01R 9/24* (2006.01)

(52) U.S. Cl.
  CPC ......... *H05K 5/0021* (2013.01); *H05K 5/0247* (2013.01)

(58) Field of Classification Search
  USPC .................................................. 439/637, 188
  See application file for complete search history.

(56) References Cited

U.S. PATENT DOCUMENTS

| | | | | |
|---|---|---|---|---|
| 4,106,841 A | * | 8/1978 | Vladic | H01R 23/70 439/188 |
| 4,285,565 A | * | 8/1981 | Kirby | H01R 12/721 439/637 |
| 4,514,030 A | * | 4/1985 | Triner | H01R 12/721 439/188 |
| 5,239,748 A | * | 8/1993 | Hamilton | H05K 1/117 29/843 |
| 5,259,768 A | * | 11/1993 | Brunker | H01R 13/6474 29/874 |
| 5,533,907 A | * | 7/1996 | Kozel | H01R 13/7034 200/51.1 |
| 6,244,881 B1 | | 6/2001 | Hara | |
| 6,764,345 B1 | * | 7/2004 | Duesterhoeft | H01R 12/721 439/637 |
| 7,269,037 B2 | | 9/2007 | Marquardt | |
| 7,748,988 B2 | * | 7/2010 | Hori | H01R 12/721 439/417 |
| 2004/0266268 A1 | * | 12/2004 | Arias | H04Q 1/142 439/637 |
| 2014/0226377 A1 | | 8/2014 | Goetz et al. | |

FOREIGN PATENT DOCUMENTS

| | | |
|---|---|---|
| DE | 102011004355 A1 | 8/2012 |
| DE | 102014103420 A1 | 9/2015 |
| DE | 102015112512 A1 | 2/2017 |
| EP | 1251595 B1 | 8/2004 |
| JP | 6315582 U | 2/1988 |
| JP | 10189152 A | 7/1998 |

OTHER PUBLICATIONS

Notification of Reasons for Rejection for Japanese Application No. 2017-165008, dated Aug. 7, 2018, 5 pages.

* cited by examiner

MODULAR SYSTEM HAVING A PLURALITY OF MODULES THAT CAN BE ELECTRICALLY CONNECTED TO ONE ANOTHER

CROSS-REFERENCE TO RELATED APPLICATIONS

This application claims priority to German Patent Application No. DE 10 2016 116 127.6, filed Aug. 30, 2016, the contents of such application being incorporated by reference herein in its entirety.

FIELD OF THE INVENTION

The invention relates to a modular system having a plurality of modules that can be electrically connected to one another in accordance with the preamble of claim 1.

BACKGROUND OF THE INVENTION

Modern electronic circuits in motor vehicles and in industrial systems comprise a large number of electrical consumers, electric energy sources and energy storage means. It is known to construct electronic circuits of this type in a modular manner. This means that individual modules can be added to or removed from the electronic circuits without a large amount of expenditure on assembly.

DE 10 2011 004 355 A1, which is incorporated by reference herein, discloses a module for power distribution in an electrically operated vehicle. Said module consists of a housing, a main HV connection and at least two connections on the output side. A reserve connection is also provided, which is bypassed when it is not used.

EP 1 251 595 B1, which is incorporated by reference herein, discloses a modular control installation for control and automation systems. Individual modules are electrically interconnected to one another. For said interconnection, the contacts of the connection strip of a module are electrically connected to the contact strip of another module under the force of a spring.

As further prior art, reference is made to DE 10 2015 112 512, which is incorporated by reference herein, US 2014/0226377, which is incorporated by reference herein, and U.S. Pat. No. 7,269,037, which is incorporated by reference herein.

SUMMARY OF THE INVENTION

In contrast, the present invention is based on the object of providing a modular system that makes it possible to extend an electronic circuit during operation. Furthermore, a method for extending the electronic circuit during operation will also be provided.

Said object is achieved by a modular system as claimed in claim 1 and by a method as claimed in claim 10. Embodiments of the invention are specified in the dependent claims.

In the context of the present description, a modular system is understood to mean, in particular, a system that comprises a plurality of different components that can be connected to one another to form a functioning system. The modular system comprises a plurality of modules. Said modules can be assembled with one another in different combinations to form different functioning electronic circuits. A module may comprise, for example, an energy storage means, an energy source and/or an electrical consumer.

Two first modules from amongst the modules can be connected to one another in series. In the connected state of the first modules, a first contact-making means is arranged between the first modules. A second of the modules has a second contact-making means. The first and the second contact-making means are configured to make electrical contact with one another. This may involve a plug and a socket, for example. The first contact-making means may be connected to the first modules, for example, by means of one or more cables. The second module may comprise, for example, one or more cables and an electrical element. The second contact-making means may be connected to the electrical element by means of the cable or cables. The electrical element may be, for example, an energy source, an energy storage means or an electrical consumer.

The first and the second contact-making means are configured, when making electrical contact with one another, firstly to connect the first modules to the second module and then to isolate the connection of the first modules to one another. After the connection of the first modules to one another has been isolated, the two first modules are preferably connected in series with the second module.

The effect achieved by the arrangement of the first and the second contact-making means is that the connection of the first modules to one another is retained as long as the first modules are connected to the second module. Therefore, the electronic circuit that is constructed with the modular system can continue to operate while the second module is being added.

It is also possible for the first and the second contact-making means to be configured such that the contact connection of the first contact-making means to the second contact-making means is releasable, by virtue of the fact that firstly the two first modules are electrically connected to one another and then the connection of the first modules to the second module is isolated. This makes it possible to remove the second module from the electronic circuit that is constructed with the modular system during operation.

It may be necessary to add the second module, for example, when a module of the electronic circuit is faulty. It may also be desirable to extend the functions of the electronic circuit by the second module. It may be desirable to remove the second module from the electronic circuit when the second module is faulty.

In accordance with one embodiment of the invention, the first contact-making means may comprise at least two first conductors. A spring force can act on at least one of the two first conductors and push said first conductor in the direction of the other first conductor. The spring force can be exerted, for example, by a spring element. Alternatively or in addition, one of the first conductors or both first conductors may be configured to be elastically resilient themselves.

In accordance with one embodiment of the invention, it is possible for the second contact-making means to be able to be pushed between the two first conductors in order to produce the contact connection. This is particularly advantageous when the spring force acts on at least one of the first conductors. The spring force thus ensures a connection of the first conductors to the second contact-making means.

In accordance with one embodiment of the invention, the second contact-making means may comprise at least two second conductors and an isolating means. The second conductors can be isolated from one another by the isolating means. The first and the second contact-making means can be configured such that, when producing the contact connection between the first and the second contact-making means, in each case one of the first conductors comes into contact with one of the second conductors before the connection of the two first conductors to one another is released.

It is therefore possible to produce two electrical connections, namely in each case between one of the first and one of the second conductors, before the electrical connection of the two first conductors to one another is released. When producing the contact connection between the first contact-making means and the second contact-making means, there may therefore be at least a brief moment in which the two first modules are directly connected to one another and in which the second module is connected to the two first modules.

In accordance with one embodiment of the invention, the second contact-making means may be rounded off at the end that is configured to produce the contact connection to the first contact-making means. In the context of this description, a rounded-off end is understood to mean, in particular, that the second contact-making means becomes continuously narrower toward the end.

The rounded-off end of the second contact-making means is particularly advantageous for producing the contact connection between the second contact-making means and the first contact-making means. The rounded-off end firstly produces a connection between the second module and the first modules without the connection of the first modules to one another being isolated. When the second contact-making means is then inserted further into the first contact-making means, the connection of the first modules to one another is isolated.

In accordance with one embodiment of the invention, the second contact-making means may have a tapered portion. A tapered portion of this kind is particularly advantageous when a spring force acts at least on one of the first conductors of the first contact-making means. The spring force then pushes said first conductor into the tapered portion of the second contact-making means such that a particularly fixed contact is achieved between the first and the second contact-making means.

In accordance with one embodiment of the invention, the first conductors may have a curvature that is adapted to the shape of the tapered portion of the second contact-making means. As a result, a particularly good contact connection between the first contact-making means and the second contact-making means is achieved.

In accordance with one embodiment of the invention, it is possible for the second module to be able to be switched to a state in which the second conductors are at the same electrical potential. In said state, the second module can be added to an electronic circuit during operation particularly well, since no possibly dangerous overvoltages are expected.

In accordance with one embodiment of the invention, the second module may comprise a further first contact-making means for a contact connection to a second contact-making means of a further second module from amongst the modules. This is particularly advantageous because the electronic circuit that is constructed with the modular system is therefore able to be extended even further, after the second module has already been added. The flexibility and extendability of the electronic circuit that is constructed with the modular system are therefore increased even further. The further first contact-making means can be configured, in particular, exactly like or similar to the first contact-making means that has already been described above.

Alternatively to the mechanical isolation of the connection of the two first modules to one another, it is also possible for the modular system to comprise a control element, which is configured to detect when the second module is connected to the two first modules. Furthermore, the control element may be configured, after detecting the connection between the second module and the two first modules, to isolate the connection of the two first modules to one another by virtue of the fact that a switching element is opened, for example.

In accordance with the method as claimed in claim 10, the first contact-making means makes electrical contact with the second contact-making means such that the second module is electrically connected to the first modules. The direct electrical connection of the first modules to one another is subsequently isolated. The second module is then connected in series with the two first modules.

BRIEF DESCRIPTION OF THE DRAWING FIGURES

Further features and advantages of the present invention will become clear from the following description of preferred exemplary embodiments with reference to the accompanying Figures. Here, the same reference numerals are used for identical or similar components and for components having identical or similar functions.

Figure 4A:
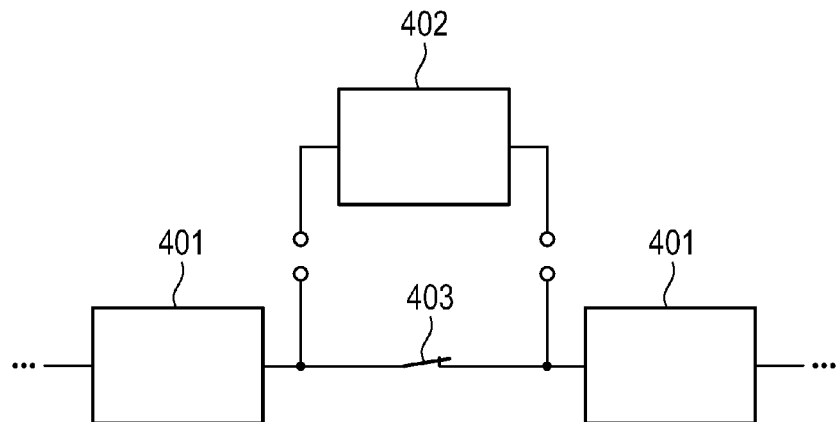
Figure 4B:
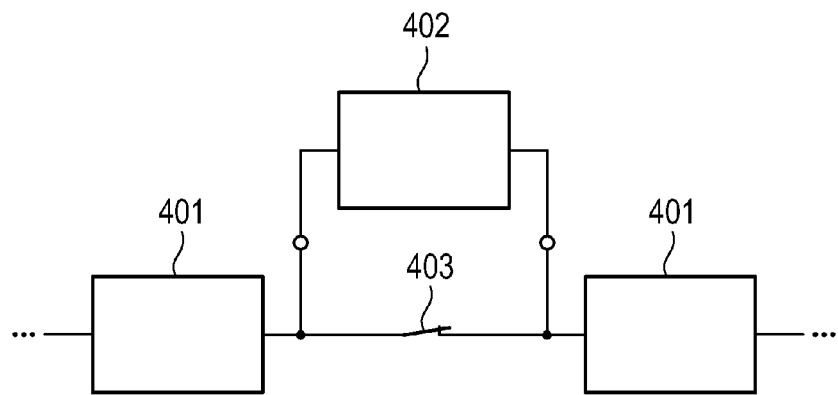
Figure 4C:
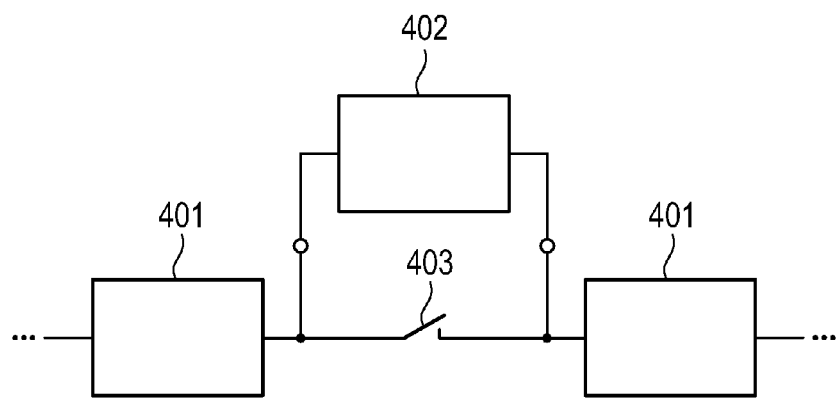

FIGS. 4a, 4b, and 4c to c show a section of a schematic electrical circuit diagram during the contact-making procedure of the first and the second contact-making means with two first modules connected (FIG. 4a), with the two first modules connected and a second module connected to the two first modules (FIG. 4b), and with the two first modules disconnected (FIG. 4c).

Figure 5:
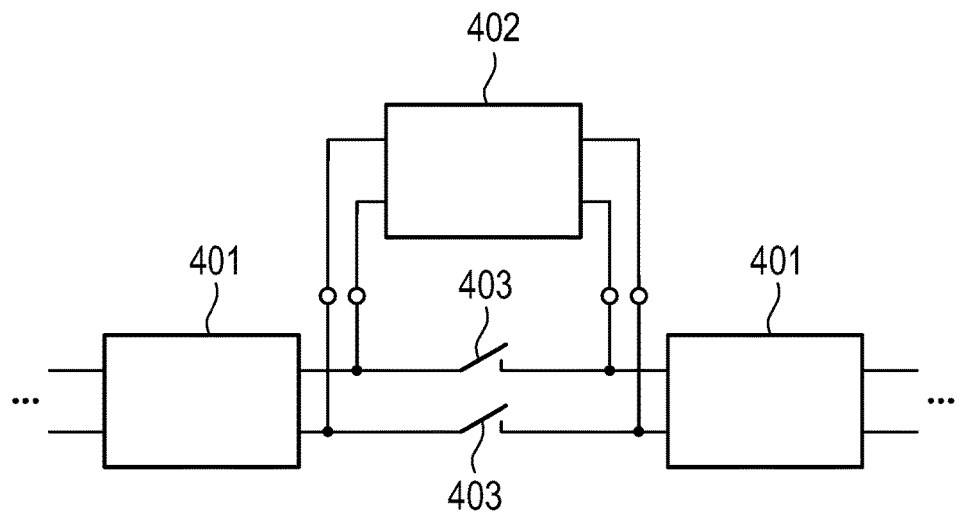

FIG. 5 shows a section of a schematic electrical circuit diagram of one embodiment of the invention.

Figure 6:
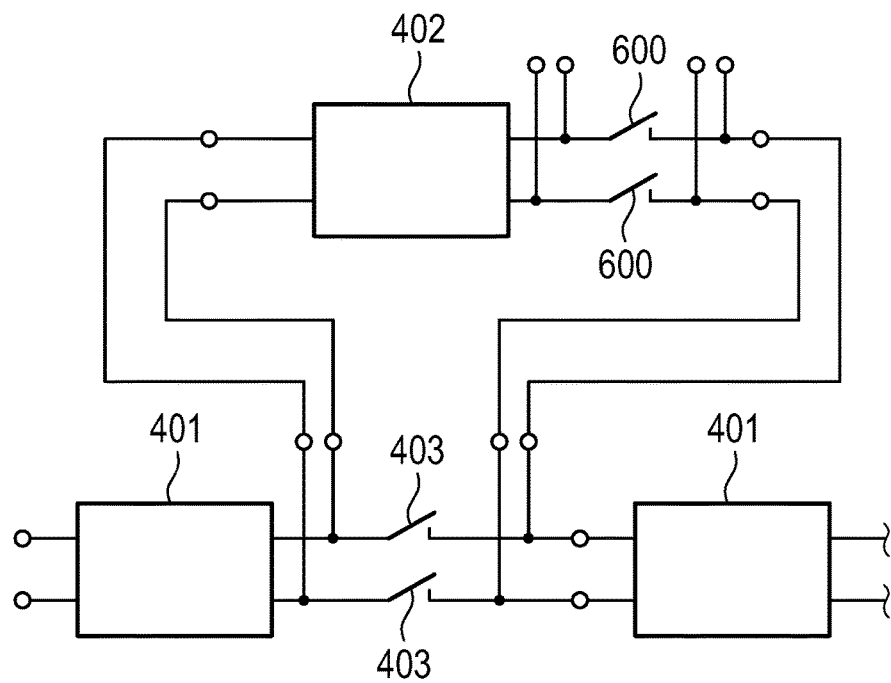

FIG. 6 shows a section of a schematic electrical circuit diagram of one embodiment of the invention.

Figure 7:
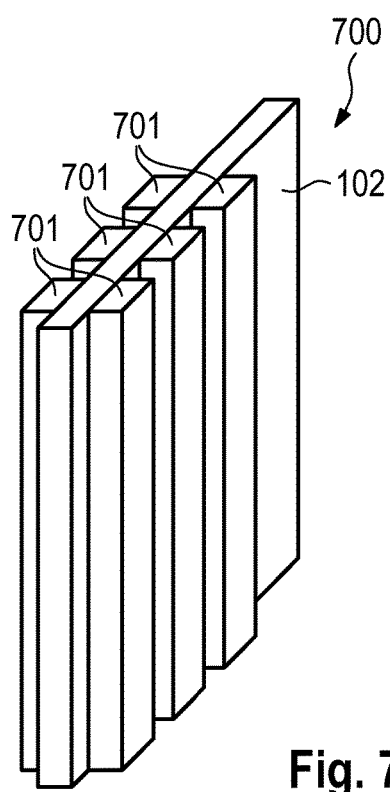

FIG. 7 shows a schematic perspective view of a second contact-making means in accordance with one embodiment of the invention.

Figure 8:
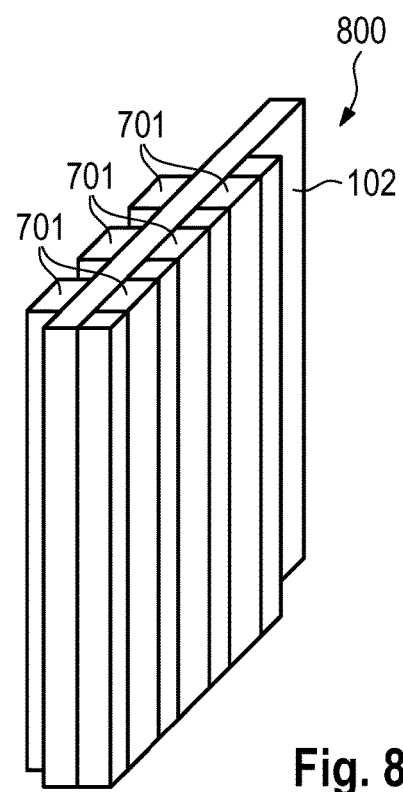

FIG. 8 shows a schematic perspective view of a second contact-making means in accordance with one embodiment of the invention.

Figure 9:
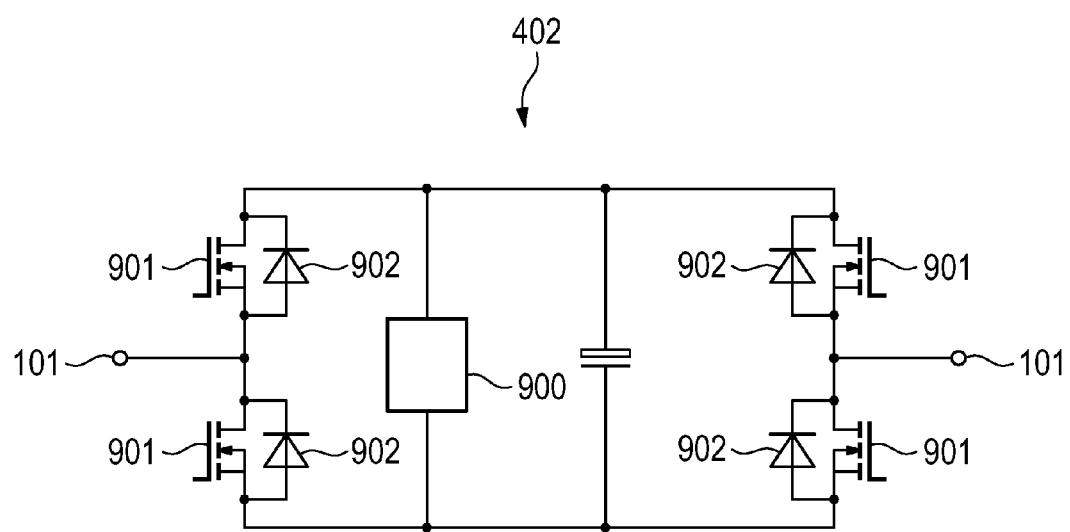

FIG. 9 shows a schematic circuit diagram of a second module in accordance with one embodiment of the invention.

DETAILED DESCRIPTION OF THE INVENTION

Figure 1:
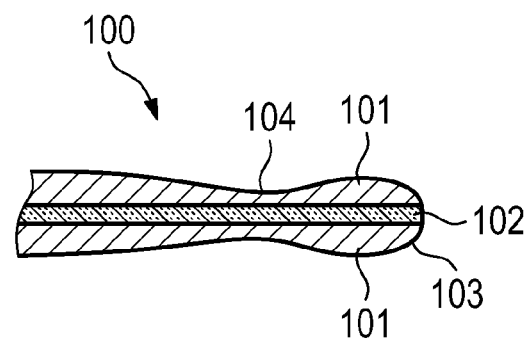
FIG. 1 shows a schematic view of a second contact-making means in accordance with one embodiment of the invention.
Figure 2:
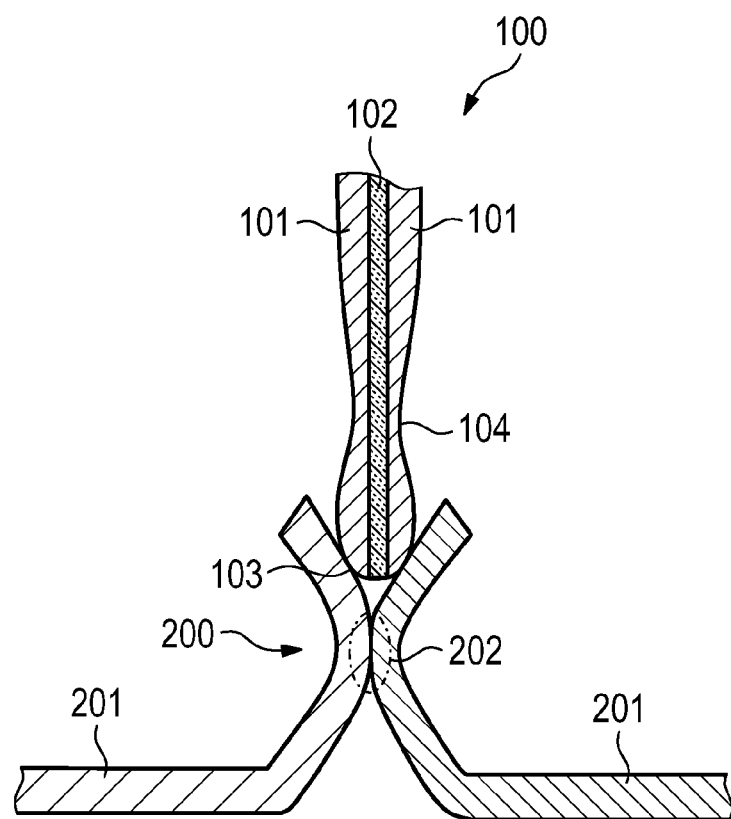
FIG. 2 shows a schematic view of the second contact-making means from FIG. 1 and a first contact-making means.
Figure 3:
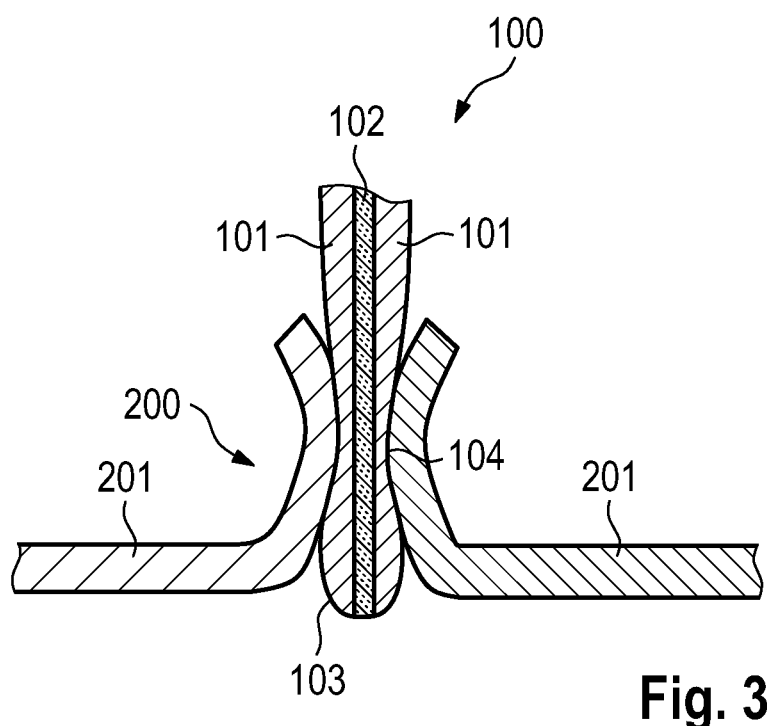
FIG. 3 shows a schematic view of the first and the second contact-making means from FIG. 2 in the mutually contacted state.

FIG. 1 illustrates a second contact-making means 100 of a second module, which is configured to make contact with a first contact-making means 200 (see FIGS. 2 and 3). The second contact-making means 100 comprises two second conductors 101 that are isolated from one another by an isolating means 102. At the end 103 that is configured to make contact with the first contact-making means 200, the second contact-making means 100 is rounded off. Furthermore, the second contact-making means has a tapered portion 104.

FIG. 2 illustrates the second contact-making means 100 and the first contact-making means 200. The first contact-making means 200 comprises two first conductors 201, which touch one another in a contact-making region 202. The two first conductors 201 are in each case connected to a first module. The first modules are not illustrated in FIG. 2.

In FIG. 2, the rounded-off end 103 of the second contact-making means 100 is already in contact with the first conductors 201. However, the connection of the two first conductors 201 to one another is not isolated yet. In FIG. 2, in each case one second conductor 101 is in contact with a first conductor 201. The first and the second conductors 101 and 201 can in each case be configured as cables, for example.

The first conductors 201 have a curved shape, in particular in the contact-making region 202 and in the adjoining regions, said curved shape being adapted to the tapered portion 104 of the second contact-making means 100. A spring force pushes the two first conductors 201 toward one another. For example, the two first conductors 201 can be made of an elastically deformable material and can exert the spring force on one another themselves.

In FIG. 3, the second contact-making means 100 is pushed further between the two first conductors 201, such that the two first conductors 201 are no longer touching and are electrically isolated from one another by the isolating means 102. The two first conductors 201 adjoin the tapered portion 104. The spring force that acts on the first conductors 201 achieves a particularly good connection between the first conductors 201 and the second conductors 101.

When looking at FIGS. 2 and 3 together, it becomes particularly clear that firstly a connection between the second contact-making means 100 and the first contact-making means 200 is produced before the connection of the two first conductors 201 to one another is isolated.

FIGS. 4a to 4c illustrate the contact-making process between the second contact-making means 100 and the first contact-making means 200 by means of schematic electrical circuit diagrams. Two first modules 401 and one second module 402 are illustrated. In FIG. 4a, the two first modules 401 are connected to one another by means of a switching element 403. In the circuit diagram, the switching element 403 is the equivalent of the first conductors 201 pushed toward one another by the spring force. In FIG. 4a, the second module 402 is not yet connected to the first modules 401.

The circuit diagram illustrated in FIG. 4b is the equivalent, in terms of circuitry, of the state illustrated in FIG. 2. The second module 402 is connected to the first modules 401. At the same time, the two first modules 401 are still connected to one another by means of the switching element 403. Therefore, the two first conductors 201 are not yet isolated from one another by the isolating means 102.

The circuit diagram illustrated in FIG. 4c is the equivalent, in terms of circuitry, of the state illustrated in FIG. 3. The second contact-making means 100 is now pushed so far between the two first conductors 201 that the two first conductors 201 are no longer directly connected to one another. The switching element 403 is therefore illustrated as open.

It becomes particularly clear from FIGS. 4a to 4c that the second module 402 is firstly connected to the first modules 401 before the connection of the two first modules 401 to one another is isolated. The second module 402 can therefore be integrated into the electronic circuit during operation of the first modules 401 and optionally further components, which are not illustrated in the Figures.

FIG. 5 illustrates an alternative embodiment of the first contact-making means 200 and of the second contact-making means 100. The first contact-making means 200 comprises four first conductors. The second contact-making means 100 comprises four second conductors. The principle of the contact-making operation is similar to that already described above, such that the switching means 403 are open after contact is made.

The embodiment illustrated in FIG. 6 differs from the embodiment from FIG. 5, in particular, in that there is a further first contact-making element, which is illustrated in the electrical circuit diagram by further switching elements 600. The further first contact-making element can be used to extend the electronic circuit in a flexible manner, for example by a further second module 402.

FIG. 7 illustrates an alternative second contact-making means 700. Said alternative second contact-making means comprises a total of six second conductors 701, which are all isolated from one another by an isolating means 102. Said second contacting-making means 700 can be used in a similar manner to the second contact-making means 100 described above with the difference that the contact connection to the first contact-making means is produced by three conductors in each case.

The second contact-making means 800 illustrated in FIG. 8 differs from the contact-making means 700 from FIG. 7, in particular, in that the second conductors 701 are arranged in recesses of the isolating means 102. In this way, the second contact-making means 800 is able to be plugged in an improved manner. FIG. 8 illustrates that three of the second conductors 701 form a flush surface with the isolating means 102. However, it is also possible for the recesses of the isolating means 102 to be deeper than the thickness of the second conductors 701. As a result, the second contact-making means 800 is able to be plugged and guided in an even further improved manner.

The schematic circuit diagram of the second module 402 illustrated in FIG. 9 comprises an electrical element 900, which may be, for example, an electric energy source, an electric energy storage means or an electrical consumer, for example. The two second conductors 101 can be connected to one another by means of the switching elements 901. When adding the second module 402 to an electronic circuit, either all switching elements 901 can be open or all switching elements 901 can be closed. In both cases, the two second conductors 101 are each at the same electrical potential. When the switching elements 901 are open, the diodes 902 form a rectifier and prevent the possible build-up of a voltage through the electrical element 900.

When the two second conductors 101 are at the same electrical potential, the second module 402 can be integrated into an existing electronic circuit during operation in a particularly low-interference manner or even in an interference-free manner.

It is also possible for the second module 402 to comprise an overvoltage arresting means in order to prevent damage to the switches 901 in the event of an unexpected overvoltage.

What is claimed is:
1. A modular system, comprising:
a plurality of modules that can be electrically connected to one another;
a first contact-making means; and
a second contact-making means;
wherein at least two first modules from amongst the modules can be connected to one another in series, wherein, in a connected state of the first modules, the first contact-making means is arranged between the first modules, wherein a second module from amongst the modules has the second contact-making means, wherein the first contact-making means and the second contact-making means are configured to make electrical contact with one another, wherein the first contact-making means and the second contact-making means are configured, when making electrical contact with one another, firstly to connect the first modules to the second module and then to isolate the connection of the first modules from one another.

2. The modular system as claimed in claim 1, wherein the first contact-making means comprises at least two first conductors, wherein a spring force acts on at least one of the two first conductors and pushes said at least one of the two first conductors in the direction of the other of the at least two first conductors.

3. The modular system as claimed in claim 2, wherein the second contact-making means can be pushed between the two first conductors in order to produce the contact connection.

4. The modular system as claimed in claim 1, wherein the second contact-making means comprises an isolating means and at least two second conductors that are isolated from one another by the isolating means, wherein the first contact-making means and the second contact-making means are configured such that, when producing the contact connection between the first contact-making means and the second contact-making means, in each case one of the first conductors comes into contact with one of the second conductors before the connection of the two first conductors to one another is released.

5. The modular system as claimed in claim 1, wherein the second contact-making means is rounded off at an end that is configured to produce the contact connection to the first contact-making means.

6. The modular system as claimed in claim 1, wherein the second contact-making means has a tapered portion.

7. The modular system as claimed in claim 6, wherein the first conductors have a curvature that is adapted to the shape of the tapered portion, wherein the tapered portion is arranged between the first conductors in the connected state to the first contact-making means.

8. The modular system as claimed in claim 4, wherein the second module can be switched to a state in which the second conductors are at the same electrical potential.

9. The modular system as claimed in claim 1, wherein the second module comprises a further first contact-making means for making contact with a second contact-making means of a further second module of the modules.

10. The modular system as claimed in claim 1 further comprising:

a third contact-making means and a fourth contact-making means, wherein, in a connected state of the first modules, the third contact-making means is arranged between the first modules, wherein the second module from amongst the modules has the fourth contact-making means, wherein the third contact-making means and the fourth contact-making means are configured to make electrical contact with one another, wherein the third contact-making means and the fourth contact-making means are configured, when making electrical contact with one another, firstly to connect the first modules to the second module and then to isolate the connection of the first modules from one another.

11. The modular system as claimed in claim 1, wherein, in a first state of the second contact-making means, the first modules are in a connected state and the first modules are disconnected from the second module, in a second state of the second contact-making means, the first modules are in a connected state and the first modules are connected to the second module, and in a third state of the second contact-making means, the first modules are in a disconnected state and the first modules are connected to the second module.

12. A method for extending an electrical circuit having a plurality of first modules having a direct electrical connection to one another by at least one second module, wherein at least one first contact-making means is arranged between the first modules, and wherein the second module has a second contact-making means, wherein the method comprises the following steps:

making electrical contact between the first contact-making means and the second contact-making means such that the second module is electrically connected to the first modules; and then isolating the direct electrical connection of the first modules from one another.

* * * * *